United States Patent [19]
Fulcher

[11] Patent Number: 5,686,764
[45] Date of Patent: Nov. 11, 1997

[54] FLIP CHIP PACKAGE WITH REDUCED NUMBER OF PACKAGE LAYERS

[75] Inventor: Edwin Fulcher, Palo Alto, Calif.

[73] Assignee: LSI Logic Corporation, Milpitas, Calif.

[21] Appl. No.: 619,909

[22] Filed: Mar. 20, 1996

[51] Int. Cl.⁶ .................... H01L 23/498; H01L 23/482; H05K 1/18; H05K 7/02
[52] U.S. Cl. .................... 527/778; 257/700; 257/691; 257/698
[58] Field of Search .................... 257/778, 779, 257/774, 700, 691, 698, 735–738

[56] References Cited

U.S. PATENT DOCUMENTS

| | | | |
|---|---|---|---|
| 5,237,448 | 8/1993 | Perkins et al. | 257/778 |
| 5,258,648 | 11/1993 | Lin | 257/778 |
| 5,281,151 | 1/1994 | Arima et al. | 257/778 |
| 5,381,307 | 1/1995 | Hertz et al. | 257/778 |
| 5,391,917 | 2/1995 | Gilmour et al. | 257/778 |
| 5,510,758 | 4/1996 | Fujita et al. | 257/778 |
| 5,523,622 | 6/1996 | Harada et al. | 257/778 |

FOREIGN PATENT DOCUMENTS

| | | | |
|---|---|---|---|
| 5-144879 | 6/1993 | Japan | 257/778 |
| 94024704A1 | 10/1994 | WIPO | 257/778 |

OTHER PUBLICATIONS

A Low Cost Multichip Module Using Flex Substrate and Ball Grid Array, ICEMCM '96 Proceedings, pp. 28–32 no month.

Electrical Characterization of the Interconnected Mesh Power System (IMPS) MCM Topology, IEEE Transactions On Components, Packaging, and Manufacturing Technology–Part B, vol. 18, No. 1, Feb. 1995, pp.99–105.

Design of the Interconnected Mesh Power System (IMPS) MCM Topology, MCM '94 Proceedings, pp. 543–548 no month.

A Signal–Noise Comparison of the Interconnected Mesh Power System (IMPS) with a Standard Four–Layer MCM Topology, 1996, Michael D. Glover et al. no month.

A Design Methodology for the Interconnected Mesh Power System (IMPS) MCM Technology, 1995 IEPS Conference, pp. 192–196 no month.

Theory and Experimental Confirmation of the Interconnected Mesh Power System (IMPS) MCM Topology, The International Journal of Microcircuits and Electronic Packaging, vol. 18, No. 2, Second Quarter 1995 (ISSN 1063–1674), pp. 146–153 no month.

*Primary Examiner*—Tom Thomas
*Assistant Examiner*—Alexander Oscar Williams
*Attorney, Agent, or Firm*—Oppenheimer Poms Smith

[57] ABSTRACT

A flip chip substrate includes first and second conductive layers, and a dielectric layer interposed therebetween. Each conductive layer includes a repeating pattern of a group of I/O signal traces such as two I/O signal traces, followed by a wider power or ground trace. The I/O traces on one conductive layer lie atop or below power or ground traces on the other conductive layer. The wider power and ground traces provide shielding on either side of the I/O trace group, as well as above or below.

18 Claims, 7 Drawing Sheets

FLIP CHIP PACKAGE WITH REDUCED NUMBER OF PACKAGE LAYERS

BACKGROUND OF THE INVENTION

1. Field of the Invention

The present invention relates to the field of electronic microcircuits. More particularly, the present intention relates to the field of reducing the complexity and number of layers within a "flip chip" microcircuit package.

2. Description of the Related Art

A "flip chip" refers to a microcircuit that includes at least one semiconductor die bonded circuit side down to a substrate, with direct electrical interconnection between the die and the substrate or package. Because the die is connected directly to the substrate, traditional bond wires are eliminated. The substrate may be a passive carrier such as a printed circuit board (PCB), or it may be another semiconductor chip. Flip chips of the latter type are described in U.S. Pat. No. 5,410,805. The substrate is normally bonded directly to a motherboard, on which may be mounted other flip chips and/or other chips employing a variety of more traditional packages such as leadframe packages, surface mount, pin grid arrays, and the like.

One purpose that the substrate serves is to allow the I/O signals on the die to "escape" the die onto the motherboard. Dies are usually quite small, and contain as many as hundreds of I/O signals, as well as numerous power and ground connections. There can be "bumps" on the surface pads of the die to facilitate electrical connections to the substrate. These bumps are densely packed together onto the small die. Bump spacing of 10 mils (254 microns) is typical. It may not be practical to attempt to bond such tightly packed bumps to a motherboard. The substrate serves the purpose of spreading out these densely packed bumps to a much less dense spacing, so that these I/O's along with power and ground can then be connected to the motherboard.

In a flip chip, when the die is bonded to the substrate the bumps on the die are the points of physical and electrical contact between the die and the substrate. The bumps carry electrical signals including power and ground to and from the die. In designing the substrate, a number of electrical characteristics are desirable to be met: controlled impedance to minimize signal reflections, close coupling to the power and ground planes for good return current paths and resulting low inductance, low impedance particularly for power and ground connections, and wide spacing of signal traces to minimize crosstalk particularly when many signals may switch at the same time. Accordingly, flip chips having PCB substrates typically use at least four layers for the substrate: a first signal layer, a dedicated power plane, a second signal layer, and a dedicated ground plane. Ceramic substrates, because they have a higher dielectric constant than PCB material, may contain eight or more layers in order to achieve satisfactory performance when the die contains several hundred connections. Unfortunately, as the number of substrate layers rises so does the complexity and cost of the flip chip package.

SUMMARY OF THE INVENTION

Accordingly, it is an object of the present invention to provide a flip chip package having a reduced number of layers, yet that still exhibits good electrical characteristics.

According to the present invention, the number of layers necessary in a flip chip package is reduced by providing a first substrate layer having small groups of I/O traces such as two traces per group, with each group of I/O traces having voltage supply traces such as power traces substantially parallel to and on either side of the two I/O traces. A second substrate layer contains similar groups of two traces, with each group of two traces having voltage supply traces such as ground traces on either side of the two I/O traces. The power and ground traces may be as wide as two I/O traces side by side. The I/O traces on the first substrate layer are aligned atop power traces on the second layer, and I/O traces on the second substrate layer are aligned below ground traces on the first substrate layer. Because the I/O signal groups on the first layer are shielded on both sides by power traces and are further shielded below by a ground trace, crosstalk between these I/O signals and other signals on the substrate is greatly reduced. Accordingly, the overall density of I/O traces may be increased. Additionally, separate power and ground layers are eliminated. The overall result is a reduction in the number of layers required for a flip chip substrate, with resulting lower manufacturing complexity and cost. For a flip chip of conventional construction having two I/O signal layers and dedicated power and ground planes, by eliminating the dedicated power and ground planes the construction of the present invention allows the number of substrate layers to be reduced from four to two.

In one aspect, the present invention comprises a flip chip comprising an integrated circuit die and a substrate, the substrate having at least two conductive layers separated by an insulating dielectric layer, the two conductive layers each having a plurality of I/O signal traces and further having a plurality of voltage supply traces providing shielding for the I/O signal traces, the traces being substantially parallel and arranged in a repeating pattern of I/O signal traces followed by a voltage supply trace, the voltage supply traces on one conductive layer being arranged atop or below I/O signal traces on the other conductive layer. The result is that the number of layers required for a flip chip substrate is reduced, while maintaining good electrical characteristics of substrate.

These and other features and advantages of the present invention will be apparent to those skilled in the art from the following detailed description, taken together with the accompanying drawings, in which like reference numerals refer to like parts.

DETAILED DESCRIPTION OF THE PREFERRED EMBODIMENTS

Figure 1:
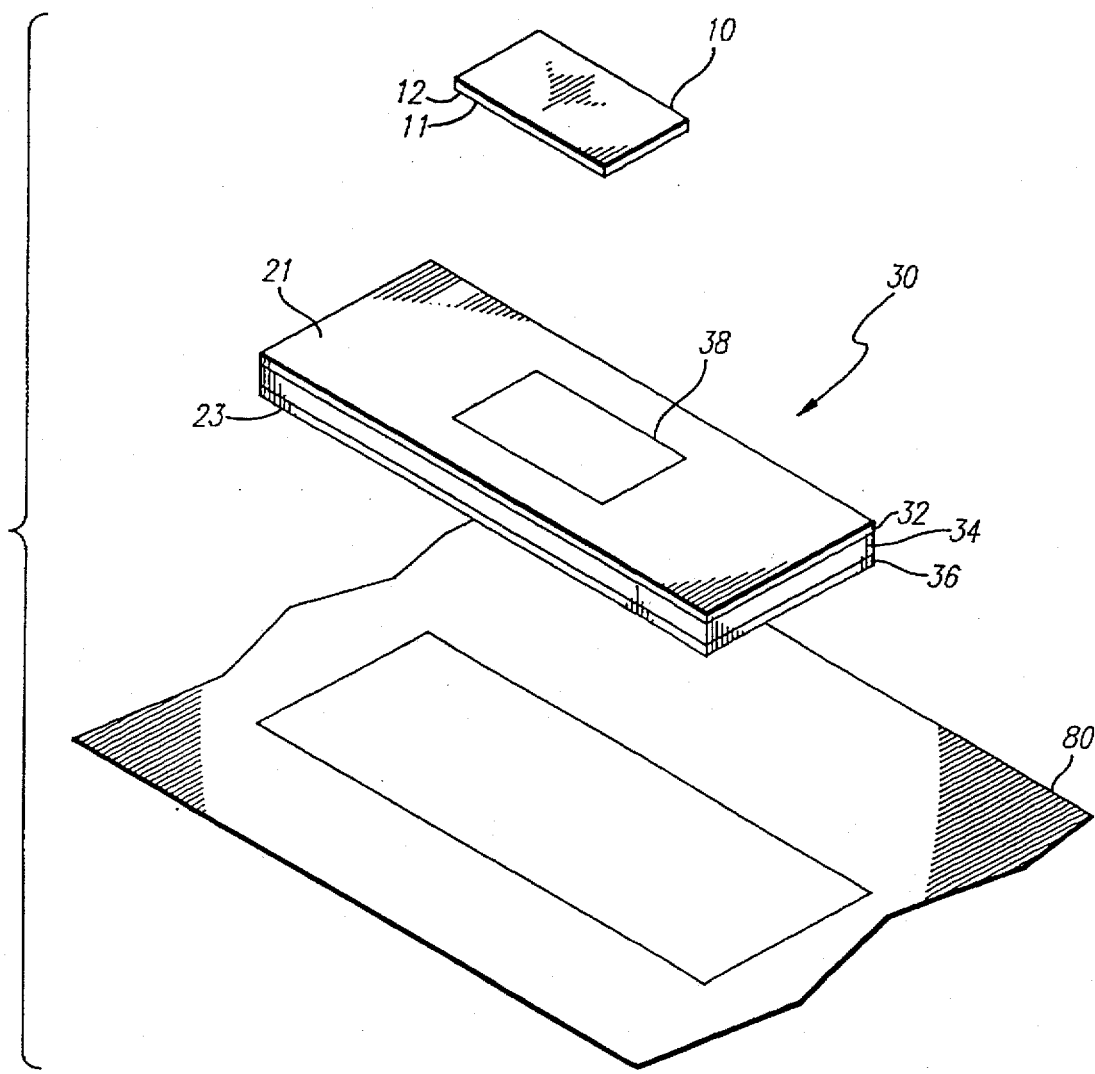
FIG. 1 is an exploded perspective drawing of a flip chip and a motherboard.

FIG. 1 shows a flip chip and a motherboard 80. The flip chip includes a die 10 and a substrate 30. Die 10 is composed of a semiconductor material with an integrated circuit 12 formed on face side 11 of die 10. A passivation layer (not shown) such as a layer made of silicon nitride protects the face side 11 from scratching. Die 10 is mounted face down, i.e., integrated circuit 12 down, to substrate 30. Die 10 is bonded to substrate 30 at die bonding area 38. Bonding is typically by soldering.

Substrate 30 includes a first conductive layer 32, a dielectric layer 34 and a second conductive layer 36. Conductive layers 32 and 36 are typically made of a copper base material plated onto dielectric layer 34, and typically patterned to create individual traces by a photolithographic process. Alternatively, substrate 30 could be formed of a plurality of layers fabricated separately and then laminated together. Dielectric layer 34 is formed of an insulating dielectric material such as polyimide, PCB laminate, PTFE (TEFLON™), FR4, BT resin, ceramic, or any other insulator used for semiconductor packages. Because the dielectric constant of ceramic is in the range of 9–10, while the dielectric constant of organic materials is in the range of 2.8–4.5, organic materials are usually preferred. This results in less capacitative coupling between signals, allowing greater trace densities on substrate 30. Other types of substrates may also be used, such as for example "decals" or printed double sided flex tape with or without stiffeners; although the illustrative embodiment focusses on a more traditional substrate, it will be understood that the present invention also applies to these newer types of substrates as well.

Figure 2:
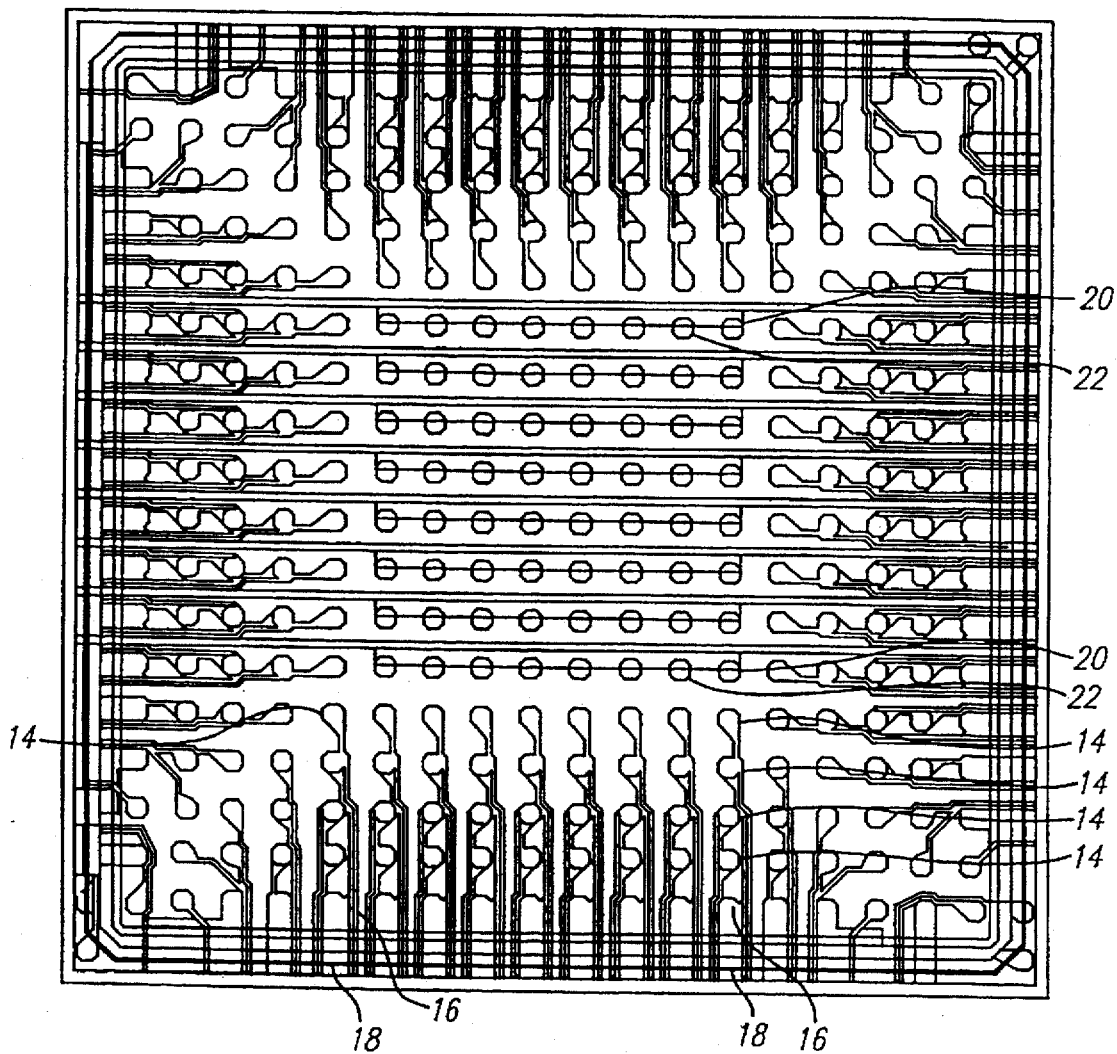
FIG. 2 is a bottom view of the die, showing the die pads or contacts and a top metallization layer.

FIG. 2 illustrates the bump pattern on the face of die 10, including a top metallization layer, for the purpose of illustrating one example of a die to which the flip chip package of the present invention will apply. Die 10 includes a plurality of I/O bumps 14, $V_{DD}$ (power) bumps 16, and $V_{SS}$ (ground) bumps 18 around the periphery. The bumps on are made of a high quality metal such as gold. $V_{DD}$ contacts 16 supply power and $V_{SS}$ contacts 18 supply ground to I/O driver transistors within integrated circuit 12. In the center region a plurality of $V_{DD2}$ (power) bumps 20 and $V_{SS2}$ (ground) bumps 22 supply power and ground to logic circuitry within integrated circuit 12. In the figure, all of the $V_{DD2}$ contacts within a row are tied together by a wide trace comprising a bus bar. $V_{SS2}$ contacts within a row are similarly tied together. $V_{DD2}$ and $V_{SS2}$ may be kept separate from $V_{DD}$ and $V_{SS}$, respectively, so that noise and transients on $V_{SS}$ and $V_{DD}$ due to switching of I/O drivers will not appear on the power and ground for the internal logic circuitry, which could cause logic errors. Spacing between contacts 14–22 is typically on the order of 8–10 mils (203–254 microns). Although a substrate for a flip chip having a single square grid array of 20×20 bumps is shown in FIG. 2, other bump patterns are used, and the present invention is applicable to these other bump patterns as well. For purposes of the present discussion, the bumps will be assumed to be spaced at 250 micron intervals.

Figure 3:
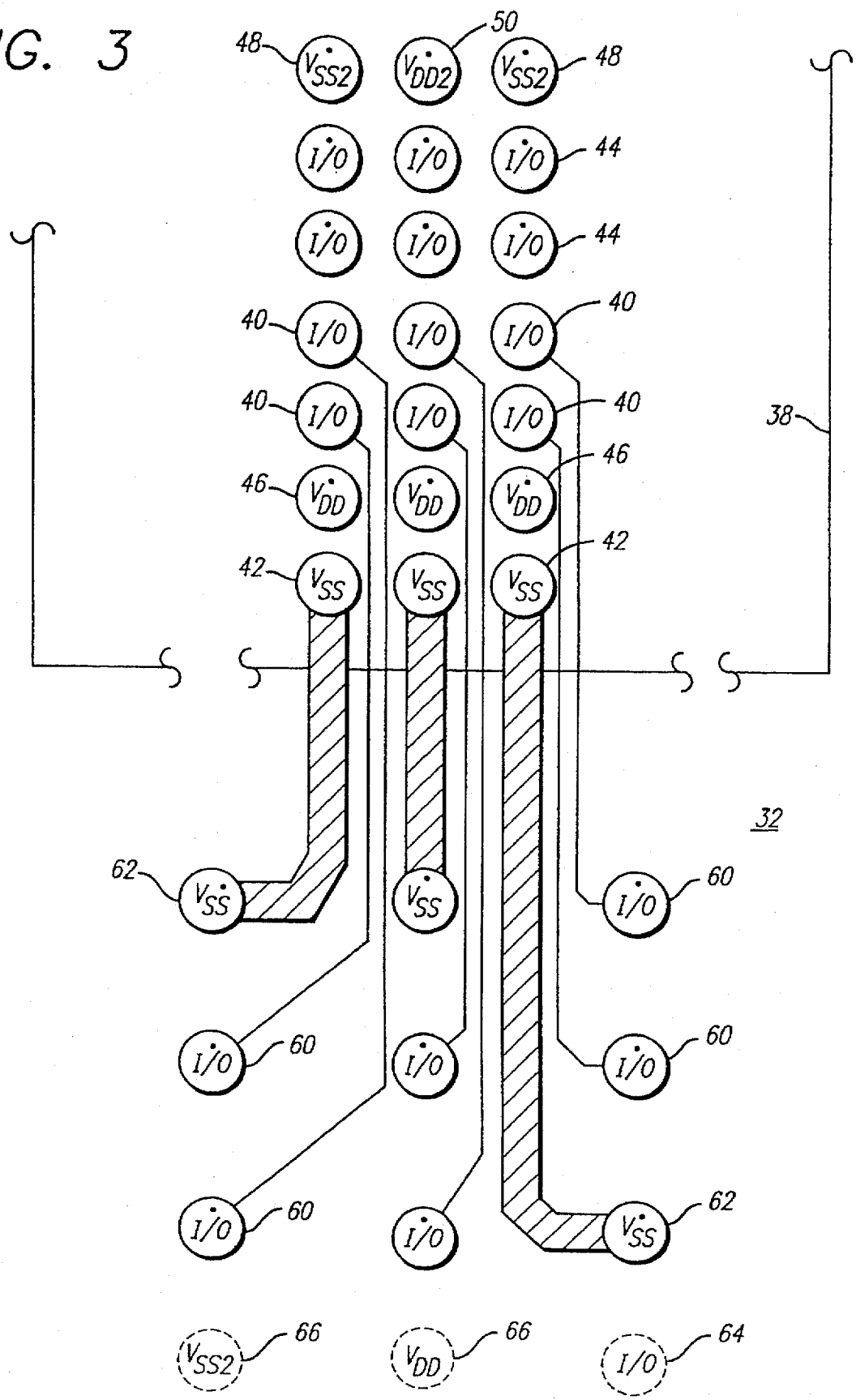
FIG. 3 is a top view of a portion of a flip chip substrate according to a first embodiment of the present invention.

Referring now to FIG. 3, on first conductive layer 32 is a plurality of contacts 40, 42, 44, 46, 48, and 50 for accommodating electrical connections between integrated circuit 12 and substrate 30. Die I/O contacts 40 carry I/O signals from die area 38 across first conductive layer 32 to vias 60 which connect through to contact points called lands (not shown) on second conductive layer 36. A solder ball is typically connected to each land, for soldering to motherboard 80. The solder balls on second conductive layer 36 are collectively termed the ball grid array, because they are usually arranged in a grid pattern. The spacing between balls is typically 1.0 or 1.27 mm, though this spacing will undoubtedly decrease as the relevant technologies improve. The vias formed in substrate 30 can be for example drilled vias, photo vias, or laser vias. The solder balls facilitate electrical connections between second conductive layer 36 and motherboard 80. $V_{SS}$ contacts 42 carry $V_{SS}$ voltage supply from die area 38 over first conductive layer 32 to vias 62 which connect to solder balls on second conductive layer 36. Thus, half of the I/O signals and all of the ground supplies are brought out from contacts 40 and 42 to the ball grid array by traces along first conductive layer 32. These traces radiate outwardly from die area 38, as shown representatively in FIG. 3.

The other half of the contacts around the periphery of die contact area 38 comprise I/O contacts 44 and $V_{DD}$ contacts 46. These contacts connect immediately through vias to second conductive layer 36 and then radiate outwardly, in a manner similar to the traces on first conductive layer 32, to connect to the ball grid array. Thus, substrate 30 serves the purpose of allowing electrical connections on die 10 spaced 250 microns apart to "escape" to electrical grid connections on motherboard 80, where the contacts are spaced 1.27 mm apart, or about five times as far apart. It will be noted that in this regard FIG. 3 is not drawn to scale.

Internal chip logic voltage supply $V_{SS2}$ contacts 48 and $V_{DD2}$ contacts 50 connect immediately through to second conductive layer 36 by vias. Wide traces such as those shown in FIG. 2 or partial planes may connect various $V_{SS2}$ contacts together. Similarly, wide traces or partial planes may connect various $V_{DD2}$ contacts together. Also, the points of contact on motherboard 80 for $V_{SS2}$ and $V_{DD2}$ may be partial planes.

FIGS. 2 and 3 are drawn illustrating a six row contact pattern, with a 4:1:1 ratio. This means that for every six contacts there are four I/O's plus one power and one ground. On each conductive layer there is a repeating pattern of two I/O traces followed by one voltage supply trace (either a power trace or a voltage trace). The 4:1:1 arrangement is particularly well suited for I/O signals that comprise differential pairs.

To provide even further shielding, I/O traces on first conductive layer 32 are aligned above $V_{DD}$ traces on second conductive layer 36, and I/O traces on second conductive layer 36 are aligned below $V_{SS}$ traces on first conductive layer 32, so as to provide shielding either above or below for each I/O signal. The voltage supply traces may be at least as wide as approximately two I/O traces plus the width separating the traces. For example, in a 30/30 trace spacing, each I/O trace is 30 microns wide, and the two I/O traces are separated by a gap of 30 microns. In this trace spacing, each voltage supply trace is at least 90 microns wide. Thus, each group of I/O signals is shielded on either side by a first voltage supply, and is further shielded either above or below by a second voltage supply. It is preferred that the voltage supply trace be slightly wider than the two I/O signal traces above or below it, so the actual width is chosen as 100 microns in the exemplary embodiment.

This arrangement allows for a high degree of shielding between signals, thus reducing crosstalk between signal traces. The only two signal traces that will experience a higher degree of crosstalk are the two adjacent signal traces. If the two signal traces comprise a differential pair the crosstalk will generally not be a problem. If the signals are not a differential pair, or if other numbers of signals within a group such as three or four signals are used, the signals chosen for grouping can be such as to minimize the possibility of crosstalk induced errors.

Other contact patterns in addition to the 4:1:1 pattern are possible. For example in a 2:1:1 arrangement, the repeating pattern would be one I/O trace followed by one voltage trace. This would reduce crosstalk every further. In a 6:1:1 arrangement, the repeating pattern would be three I/O traces followed by one voltage trace. The arrangement chosen will depend on a number of factors, including the number of bumps available to service I/O transistors, the shielding required, etc. A number of factors that influence the required spacing and shielding between signals are well known. These factors include switching speeds, the number of signals switching at once, whether signals are synchronous or asynchronous, the relative timing between two or more synchronous signals, the dielectric constant of dielectric layer 34, and other considerations. In any of the arrangements discussed herein, the exact I/O and power/ground trace widths, and the spacing between traces, may be adjusted to provide the desired path impedances.

Figure 4:
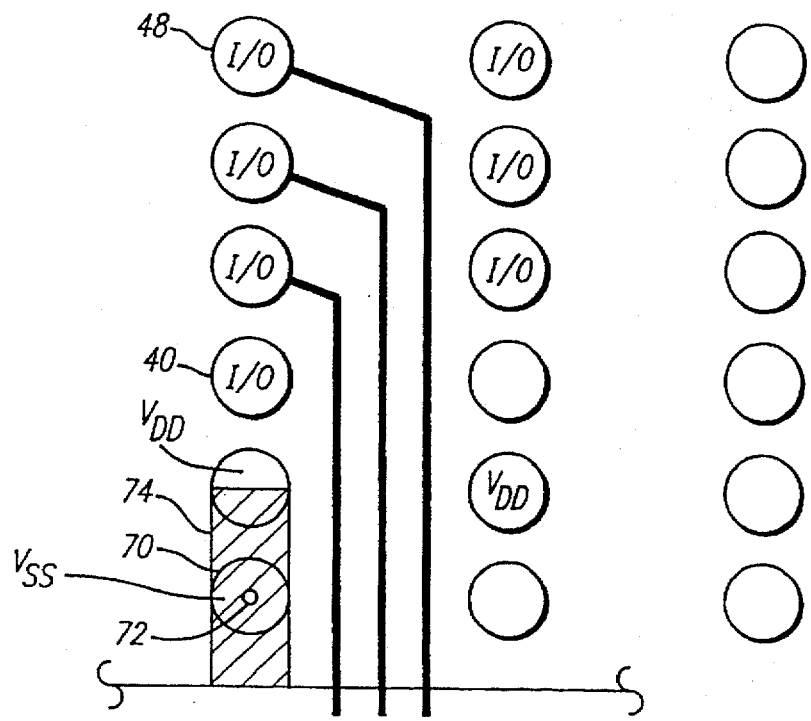
FIG. 4 is a top view of a portion of a flip chip substrate according to a second embodiment of the present invention.

In the above discussion, $V_{SS}$ traces are formed on first conductive layer 32, and $V_{DD}$ traces are formed on second conductive layer 36. This configuration was chosen with a die having $V_{SS}$ and $V_{DD}$ voltage supply rings around its periphery, with $V_{SS}$ on the outside and $V_{DD}$ on the inside, in mind. When a die having this voltage supply ring configuration is used, the trace routing is most easily accomplished by dropping $V_{DD}$ (the inner voltage) immediately through a via, and using first conductive layer 32 to carry $V_{SS}$ (the outer voltage) outward from die 10. The position of these voltage on the die could be reversed, in which case it would be advantageous to reverse the voltages on conductive layers 32 and 36. However, it is not necessary that the outermost voltage be brought out on the first conductive layer. FIG. 4 illustrates a substrate in which $V_{SS}$ pad 70 connects through to the second conductive layer by via 72. $V_{SS}$ pad 70 is covered by an insulating material, and $V_{DD}$ trace 74 routed atop $V_{SS}$ pad 72 using an additional metallization layer.

Figure 5:
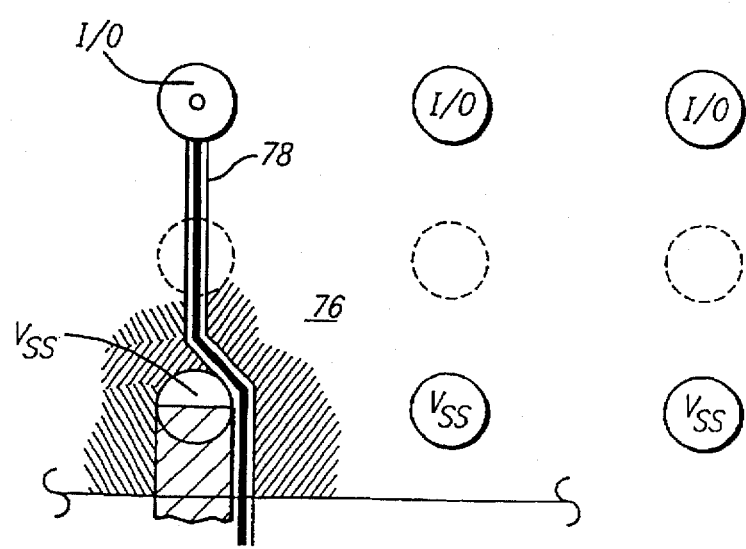
FIG. 5 is a top view of the substrate of FIG. 4, but with only the traces on the bottom surface of the substrate illustrated.

It should also be noted that the power and ground traces have been shown in the figures for simplicity as wide, linear traces. However, in order to provide the greatest amount of noise and transient immunity, the power and ground traces should be spread out so as to cover as much of the first and second conductive layers as possible. When this is done the power and ground traces become closer to being power and ground planes, which provide better shielding and transient protection than linear traces. Additionally, it is desirable to connect $V_{SS}$ traces together and $V_{DD}$ traces together at various points, so that when a high switching load is experienced on one trace an adjacent trace can assist in sourcing or draining the switching current. FIG. 5, for example, illustrates the ball side of the substrate shown in FIG. 4. In FIG. 5, a $V_{SS}$ (ground) plane 76 nearly completely surrounds I/O signal trace 78. FIGS. 4 and 5 also illustrate a substrate layout in which a different number of I/O signals comprise respective groups on different sides of the substrate. Three I/O's are grouped together on the first conductive layer (FIG. 4), and a single I/O is shielded on the second conductive layer (FIG. 5). The repeating pattern on one substrate side may also be three I/O's followed by a power trace, one I/O followed by a ground trace, three I/O's followed by a power trace, one I/O followed by a ground trace, and so on. Generally speaking, the repeating pattern is at least one voltage supply trace followed by at least one I/O signal trace.

Figure 6:
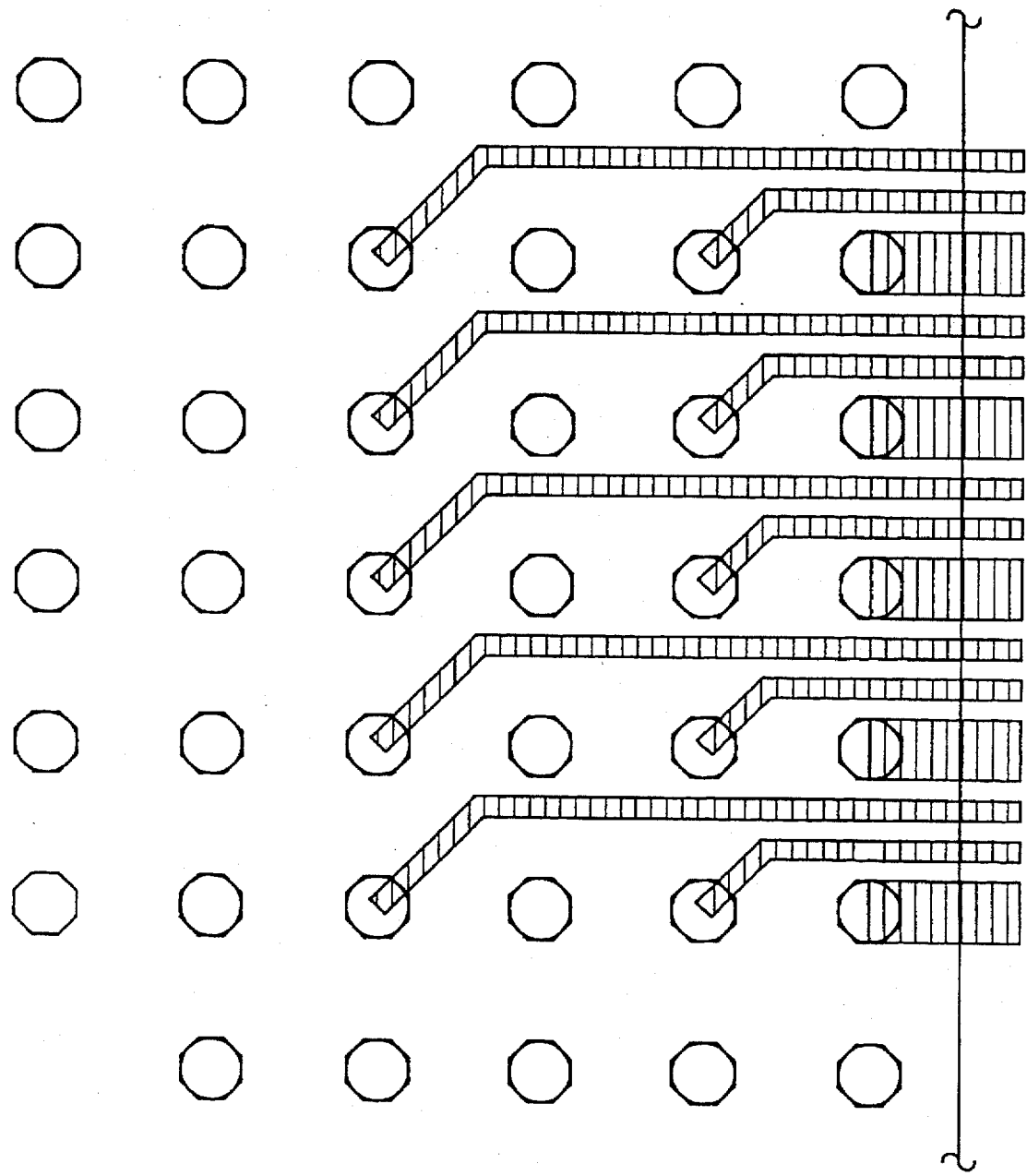
FIG. 6 is a top view of a portion of a flip chip substrate according to a third embodiment of the present invention.
Figure 7:
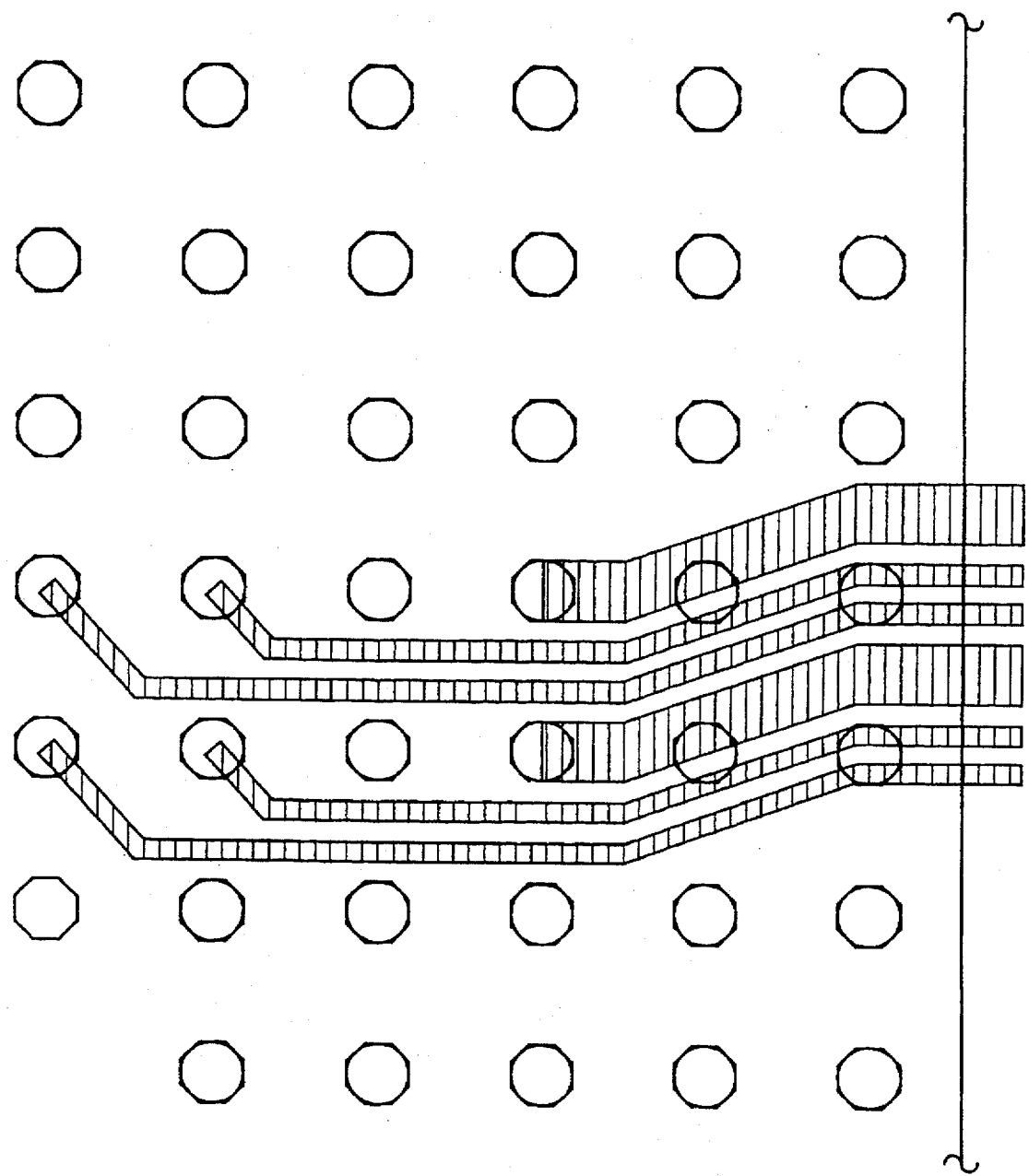
FIG. 7 is a top view of the substrate of FIG. 6, but with only the traces on the bottom surface of the substrate illustrated.
Figure 8:
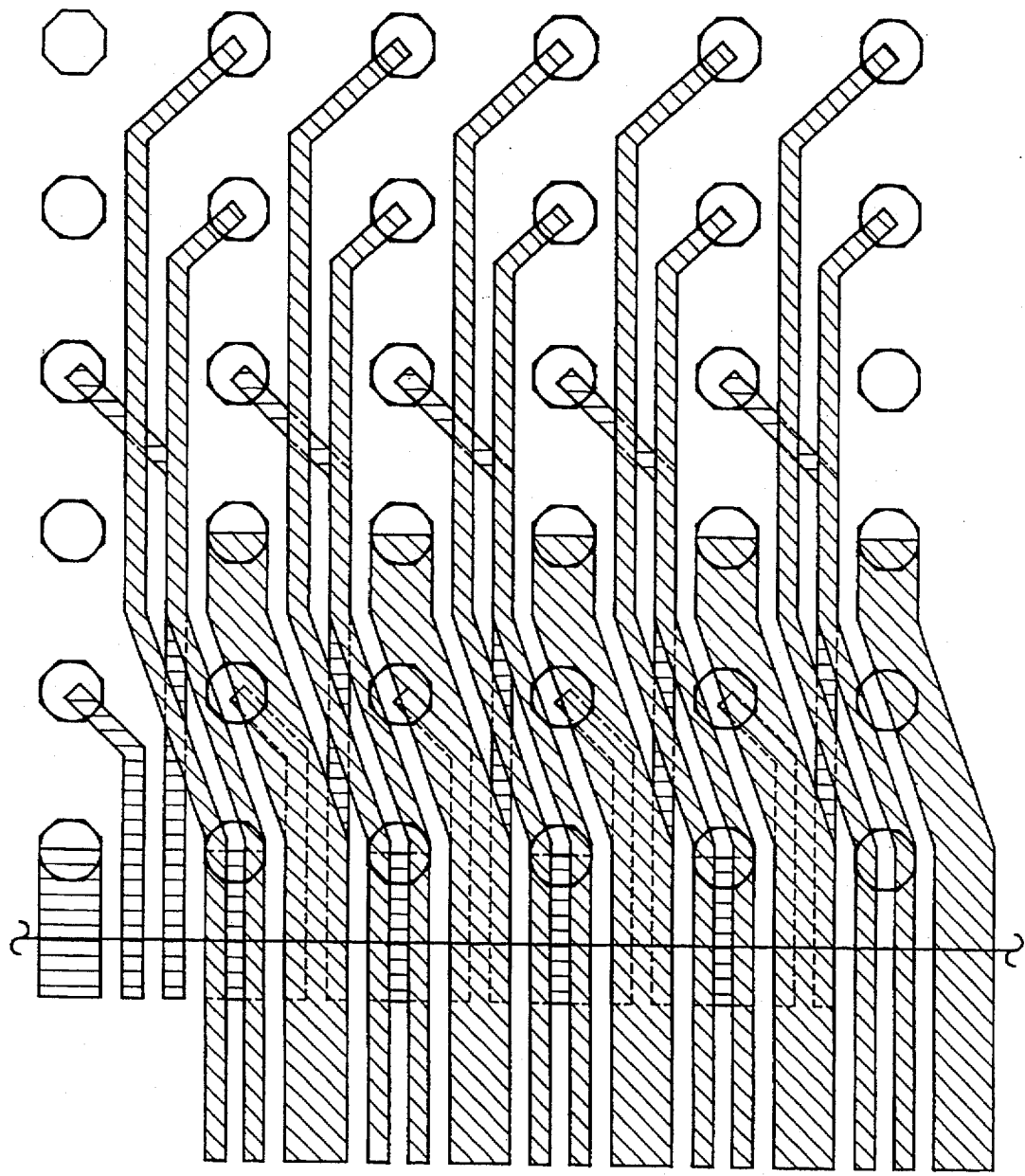
FIG. 8 is a combined view of FIGS. 6 and 7.

FIGS. 6-8 illustrate an embodiment in which the $V_{SS}$ and $V_{DD}$ contacts are not adjacent, but rather have an I/O contact interposed therebetween. These figures also illustrate that the voltage supply traces on the first conductive layer (FIG. 6) align atop I/O signals on the second conductive layer (FIG. 7), and vice versa. The combined traces are shown in FIG. 8.

Using present technology, I/O drivers can be spaced at approximately 250 microns apart around the periphery of the die. This provides sufficient spacing for a wide voltage supply trace of 100 microns, followed by two 30/30 signals, i.e., a first space of 30 microns, a first I/O trace of 30 microns, a second space of 30 microns, a second I/O trace of 30 microns, and a third space of 30 microns. This pattern is then repeated. Thus, a power trace and two signal traces are provided, having an overall width of 250 microns at the periphery of the die. The pattern is repeated across the substrate. Because each I/O trace is adjacent and unshielded from only one other trace, each I/O signal receives substantial interference from only one other I/O signal.

Although three signal traces could be interposed between two voltage supply traces, a 30/30 spacing would require a greater spacing between contacts in order to ensure a wide enough voltage trace to both supply power/ground, and to shield three I/O traces and two spaces from atop or below the I/O traces. A three I/O pattern may be optimum in some applications, depending on the amount of tolerable crosstalk, the spacing between bumps, the desired trace impedance, cost, and other considerations.

A 2:1:1 arrangement having a single I/O followed by a voltage trace is also possible. This would provide a very high degree of shielding, but would not provide as high an overall I/O trace density. This would be an attractive option, for example, for flip chips that operate at high speeds and with relatively few I/O signals.

Of course, as advances in the industry allow for further miniaturization, the teachings of the present invention can be applied to increasingly smaller packages and pinout patterns. Furthermore, the teachings of the present invention are applicable to substrates having more than two layers. It is also possible to construct a substrate having only one conductive layer, with a repeating pattern of I/O traces followed by a voltage trace according to the present invention. However, flip chips normally have more I/O signals than can be suitably handled using only a single substrate layer. It will also be noted that the present invention can be advantageously used to reduce the number of layers in a more complex substrate, as for example to reduce the number of layers necessary from six to four. Further, it will be noted that the approach of the present invention could be applied to improve the shielding between signals and/or reduce the number of layers necessary in a motherboard.

Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A flip chip comprising:

a semiconductor die; and a substrate, the substrate comprising:

a first conductive layer bonded to said semiconductor die, said first conductive layer having a plurality of I/O signal traces and first voltage supply traces of a respective first polarity arranged in a repeating pattern of adjacent traces, each pattern including N I/O traces adjacent to one another and a first voltage supply trace;

a dielectric layer having a first side and a second side, the first side affixed to said first conductive layer; and a second conductive layer aligned below said first conductive layer and affixed to the second dielectric layer side, said second conductive layer having a plurality of I/O signal traces and second voltage supply traces of respective second polarity, the I/O traces and second voltage supply traces of said second conductive layer being arranged in a repeating pattern of adjacent traces, each pattern including N I/O traces adjacent to one another and a second voltage supply trace;

wherein:

in plan view of said substrate at least a portion of each one of the first voltage supply traces of said first conductive layer is parallel and congruent with at least a portion of the I/O traces of said second conductive layer, and at least a portion of each of the second voltage supply traces of said second conductive layer is parallel and congruent with at least a portion of the I/O traces of said first conductive layer.

2. The flip chip defined in claim 1 wherein:

said substrate is free of a dedicated power plane and further is free of a dedicated ground plane.

3. The flip chip defined in claim 1 wherein:

the number of signal I/O traces in each pattern is represented by the number "N", and N is two with said portion of the I/O traces of each group each having a selected width and being spaced apart by a certain dimension; and the congruent and parallel portion of each voltage supply trace is substantially twice as wide as the I/O traces plus the certain dimension.

4. The flip chip defined in claim 3 wherein:

said substrate is free of a dedicated power plane and further is free of a dedicated ground plane.

5. A substrate for coupling at least one semiconductor die to a mother board, the substrate comprising:

a substantially planar dielectric layer having a first side and a second side;

a first conductive layer mounted to the first side of said dielectric layer, said first conductive layer having a plurality of signal traces and a plurality of first voltage supply traces;

a second conductive layer mounted to the second side of said dielectric layer, said second conductive layer having a plurality of signal traces and a plurality of second voltage supply traces;

a plurality of die contacts on said first conductive layer for contacting said at least one semiconductor die; and a plurality of mother board lands on said second conductive layer for contacting said mother board;

each of said first conductive layer and said second conductive layer including a respective repeating pattern of adjacent traces, each pattern including N signal traces adjacent to one another and said signal traces also being adjacent to a voltage supply trace of the pattern:

wherein: in plan view of said substrate at least a portion of each one of the first and second voltage supply traces of each said first conductive layer and said second conductive layer individually is of a certain width and is parallel and congruent with at least a portion of all of the respective signal traces of a pattern of the other of said first conductive layer and second conductive layer, each said at least a portion of all of the respective signal traces of a pattern of the first conductive layer and second conductive layer cooperatively having a selected width including the individual widths of each signal trace portion as well as spacings therebetween, which selected width is substantially equal to the certain width of the parallel and congruent portion of a voltage supply trace.

6. The substrate defined in claim 5, wherein:

traces on said first conductive layer are arranged in repeating patterns of N signal traces between and substantially parallel at said at least a portion of each to at least a portion of said first voltage supply traces; and traces on said second conductive layer are arranged in repeating patterns of M signal traces between and substantially parallel at said at least a portion of each to at least a portion of said second voltage supply traces.

7. The substrate defined in claim 6, wherein:

M equals N.

8. The substrate defined in claim 7, wherein:

N is two.

9. The substrate defined in claim 7, wherein:

N is three.

10. The substrate defined in claim 6, wherein:

N does not equal M.

11. The substrate defined in claim 8, wherein:

the first voltage supply traces are wider than the signal traces of said second conductive layer, and the second voltage supply traces are wider than the signal traces of the first conductive layer.

12. The substrate defined in claim 11 wherein:

the first voltage supply traces are approximately twice as wide as the signal traces of said second conductive layer, and the second voltage supply traces are approximately twice as wide as the signal traces of the first conductive layer.

13. The substrate defined in claim 5, further comprising:

at least one semiconductor die bonded to said first conductive layer.

14. A flip chip comprising:

an integrated circuit die: and a substrate, the substrate comprising:

a dielectric layer having a first side and a second side; and a first conductive layer having a die side and a bottom side, said first conductive layer having a plurality of voltage supply traces and a plurality of I/O signal traces, said integrated circuit die being affixed to the die side, said dielectric layer being affixed to the bottom side;

said substrate further comprising:

a second conductive layer having a dielectric side and a mother board side, said second conductive layer having a plurality of voltage supply traces and a plurality of I/O signal traces, said dielectric layer being affixed to the dielectric side;

wherein: the mother board side of said second conductive layer is adapted for connection to a mother board;

wherein: said first conductive layer includes plural repeating patterns each of two spaced apart I/O signal traces each having a respective width and adjacent to a voltage supply trace, said voltage supply traces of said first conductive layer being wider than said first conductive layer I/O signal traces; and said second conductive layer includes plural repeating patterns each of two spaced apart I/O signal traces each having a certain width and adjacent to a a voltage supply trace, said voltage supply traces of said second conductive layer being wider than said second conductive layer I/O signal traces;

each of said voltage supply traces of each of said first conductive layer and of said second conductive layer having in plan view of said substrate a portion which is substantially parallel and congruent with a respective portion of said I/O signal traces of the other of said first conductive layer and said second conductive layer.

15. The flip chip defined in claim 14 wherein: said first conductive layer includes a combined number of I/O and voltage supply traces that is approximately equal to the combined number of I/O and voltage supply traces on said second conductive layer.

16. The flip chip defined in claim 14 wherein:

said first conductive layer includes a plurality of bump contacts for connecting to said die, said bump contacts being spaced approximately 200 to 250 microns apart; and said second conductive layer includes a plurality of lands for connecting to a mother board, said lands being spaced approximately 1 to 1.27 millimeters apart.

17. The flip chip defined in claim 15 wherein:

said substrate is free of a dedicated power plane and further is free of a dedicated ground plane.

18. A flip chip assembly comprising:

a semiconductor die having a plurality of die contact pads for electrical interface of I/O signals power with said die, and;

a substrate having a first side and a second side, said substrate carrying said semiconductor die on said first side and providing electrical interface of said die contact pads with a plurality of substrate contacts presented on said second side;

said substrate including:

a first conductive layer affixed to said first side and electrically interfacing with die contact pads of said semiconductor die, said first conductive layer having a plurality of respective I/O signal traces and power supply traces arranged in plural repeating patterns of adjacent traces;

a second conductive layer affixed to said second side, said second conductive layer also having a plurality of respective I/O signal traces and power supply traces arranged in a repeating pattern of adjacent traces;

each repeating pattern of said first conductive layer and of said second conductive layer including a selected number of I/O traces each adjacent to at least one other I/O trace of that pattern, and a power supply trace adjacent to the selected number of I/O traces of that pattern, in a respective portion of each pattern each I/O trace having a selected width and being spaced from adjacent traces of that pattern by a certain dimension and cooperatively defining a total width for the I/O traces of that pattern in said respective portion; and in plan view of said substrate said power supply traces of each of said first conductive layer and of said second conductive layer also having a respective portion thereof with a width substantially equal to said total width of a congruent portion of said I/O traces in a pattern on the opposite side of said substrate, and where congruent with one another said portions of said I/O traces and of said power supply traces on opposite sides of said substrate also being mutually parallel.

* * * * *